(12) United States Patent
Yasseri et al.

(10) Patent No.: US 9,766,063 B2
(45) Date of Patent: Sep. 19, 2017

(54) METHOD FOR TREATING A NONHOMOGENOUS SURFACE

(71) Applicant: Lam Research Corporation, Fremont, CA (US)

(72) Inventors: Amir Yasseri, San Jose, CA (US); Duane Outka, Fremont, CA (US); Michael Lopez, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 225 days.

(21) Appl. No.: 14/855,242

(22) Filed: Sep. 15, 2015

(65) Prior Publication Data
US 2017/0074646 A1     Mar. 16, 2017

(51) Int. Cl.
*G01B 11/30* (2006.01)
*H01J 37/32* (2006.01)

(52) U.S. Cl.
CPC ........ *G01B 11/30* (2013.01); *H01J 37/32009* (2013.01); *H01J 37/32119* (2013.01); *H01J 37/32935* (2013.01)

(58) Field of Classification Search
CPC ............... G01B 11/30; H01J 37/32009; H01J 2237/334
USPC ............................ 356/237.1–237.5, 600–623
See application file for complete search history.

(56) References Cited

U.S. PATENT DOCUMENTS

2013/0321582 A1* 12/2013 Huang ................. G01B 11/303
348/46
2015/0338749 A1* 11/2015 Hinnen ..................... G03F 1/44
355/55

\* cited by examiner

*Primary Examiner* — Hoa Pham
(74) *Attorney, Agent, or Firm* — Beyer Law Group LLP

(57) ABSTRACT

A method for treating a nonhomogeneous material surface of an object is provided. A plurality of test patches of the surface is treated for different amounts of time wherein the plurality of test patches have a total surface area. A property of each test patch is measured. A calibration curve of the property is generated with respect to time. The calibration curve and a target property are used to obtain a target time. A surface of the object with a surface area, which is greater than the total surface area of the plurality of test patches, is treated for the target time.

18 Claims, 4 Drawing Sheets

20

METHOD FOR TREATING A NONHOMOGENOUS SURFACE

BACKGROUND

The present disclosure relates to the treating of a surface of an object of a nonhomogeneous material.

Surfaces of nonhomogeneous materials may be treated to change a surface property.

SUMMARY

To achieve the foregoing and in accordance with the purpose of the present disclosure, a method for treating a nonhomogeneous material surface of an object is provided. A plurality of test patches of the surface is treated for different amounts of time wherein the plurality of test patches have a total surface area. A property of each test patch is measured. A calibration curve of the property is generated with respect to time. The calibration curve and a target property are used to obtain a target time. A surface of the object with a surface area, which is greater than the total surface area of the plurality of test patches, is treated for the target time.

In another manifestation, a method for treating a ceramic surface of a power window is provided. A plurality of test patches of the surface is treated for different amounts of time wherein the plurality of test patches have a total surface area. The treatment comprises applying a mold with reservoirs on the surface of the power window, wherein each reservoir forms a test patch of the plurality of test patches, applying a liquid etchant to each test patch of the plurality of test patches at different times, and quenching all test patches of the plurality of test patches at the same time. The mold is removed. Surface roughness is measured for each test patch. A calibration curve of the surface roughness is generated with respect to time. The calibration curve and a surface roughness are used to obtain a target time. The ceramic surface of the power window with a surface area, which is greater than the total surface area of the plurality of test patches, is treated for the target time.

These and other features of the present invention will be described in more detail below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present disclosure.

Figure 1:
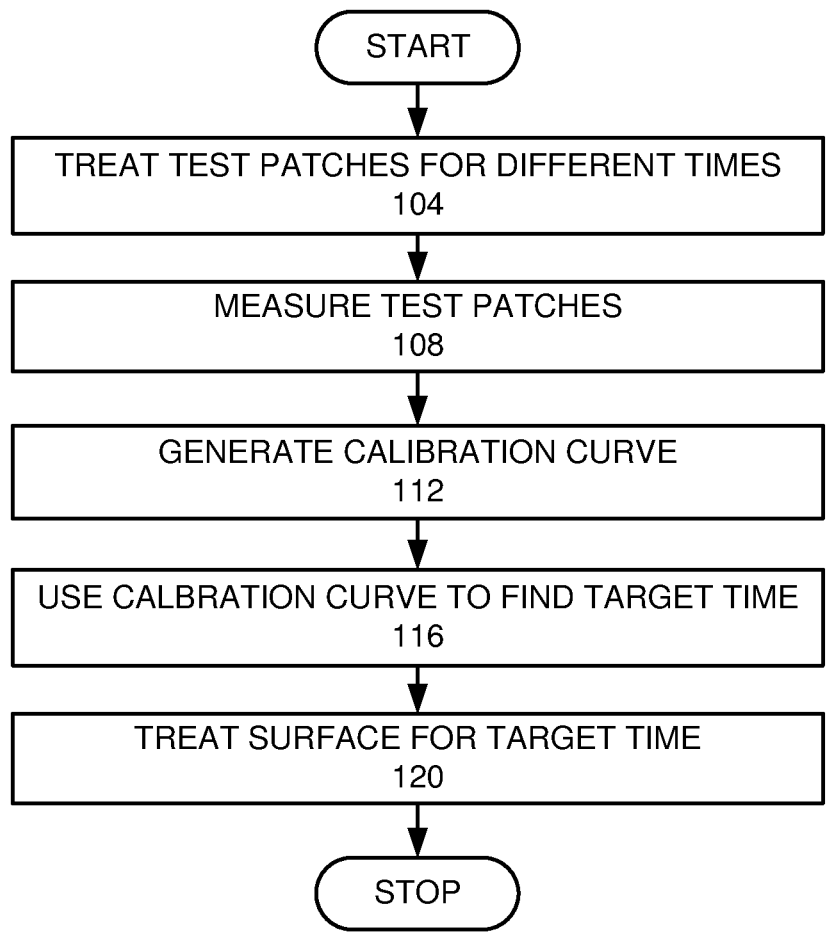
FIG. 1 is a high level flow chart of an embodiment.

To facilitate understanding, FIG. 1 is a high level flow chart of an embodiment. For an object with a surface of a nonhomogeneous material, a plurality of test patches are treated for different amounts of time (step 104). A property is measured for each test patch (step 108). The measurements are used to generate a calibration curve relating the property to time, which is the length of time of a treatment for a test patch (step 112). A target property is applied to the calibration curve to determine a target time (step 116). A treatment of the surface is performed for the target time (step 120).

Example

Figure 2:
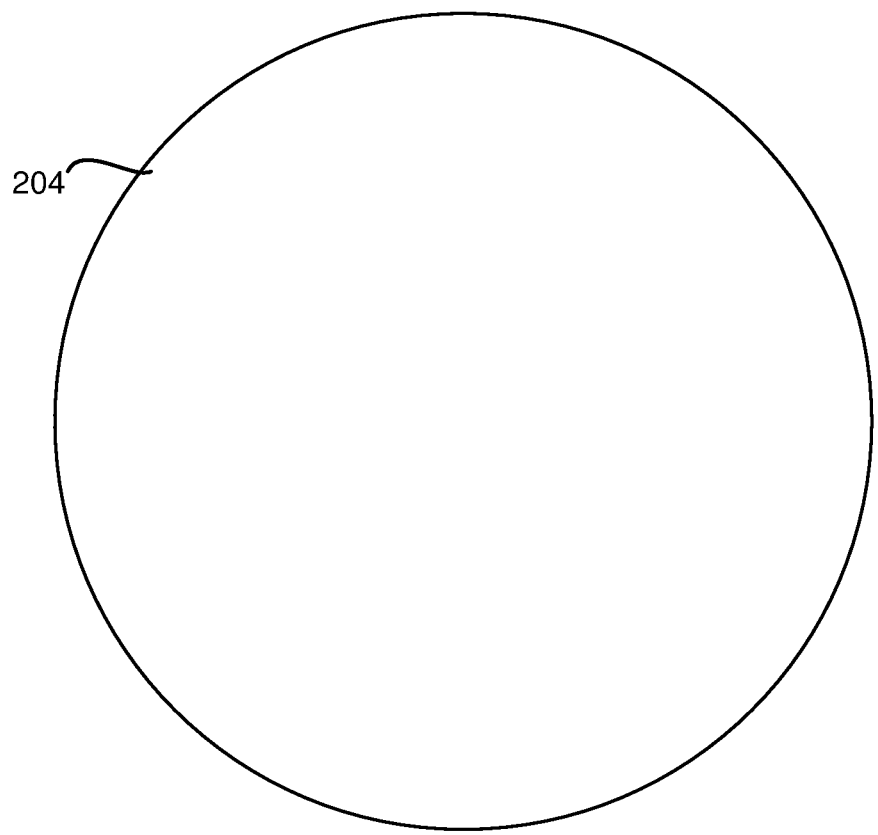
FIG. 2 is a schematic view of a power window.
Figure 3:
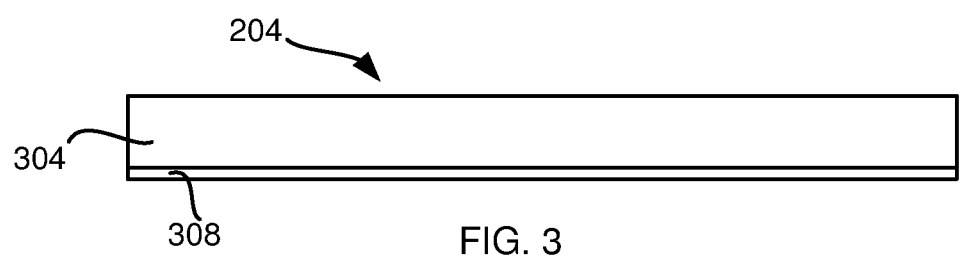
FIG. 3 is a side view of the power window.

In a specific example of an embodiment, FIG. 2 is a schematic view of the power window 204 used in a transform couple plasma reactor for processing semiconductor devices. FIG. 3 is a side view of the power window 204. In this embodiment, the power window 204 has an aluminum oxide ceramic body 304 and an yttrium oxide coating 308.

Figure 4:
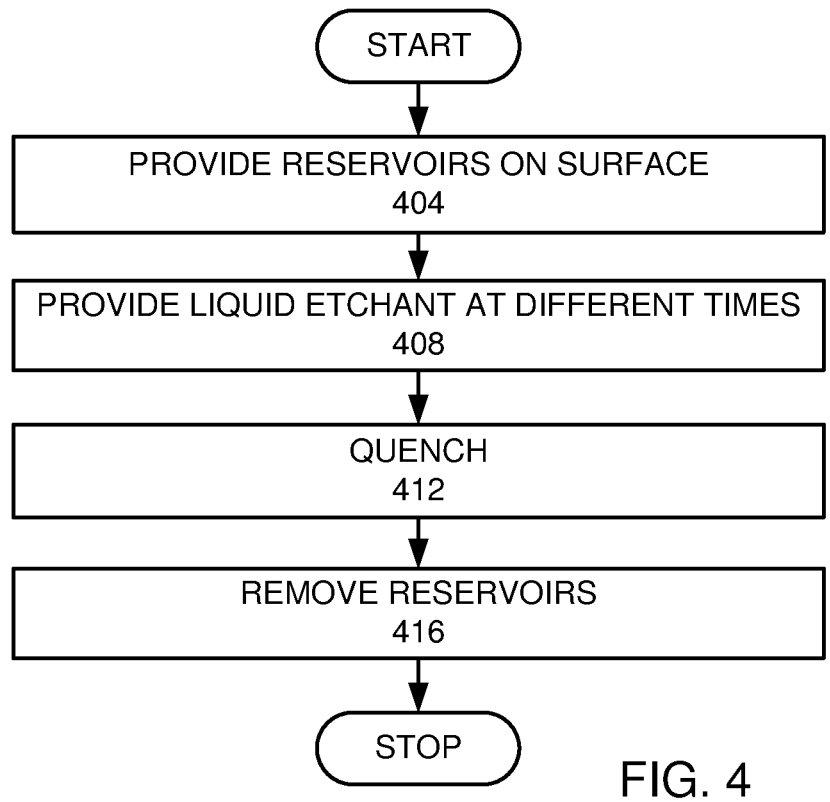
FIG. 4 is a more detailed flow chart of the step of treating a plurality of test patches.
Figure 5:
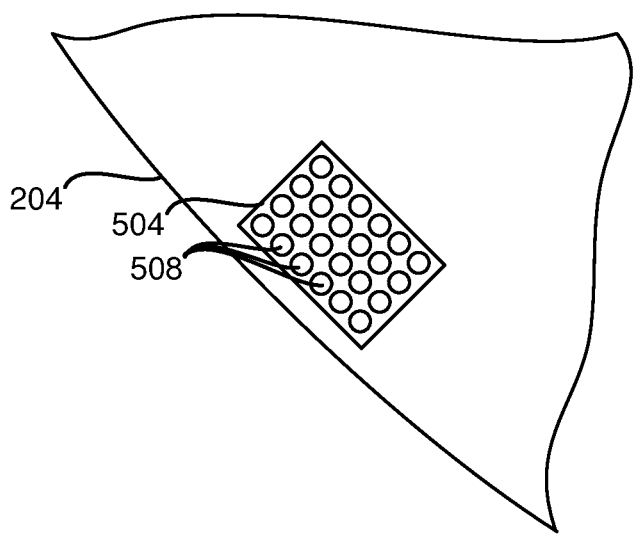
FIG. 5 shows an enlarged section of the power window with a mold forming reservoirs for a plurality of test patches.

In the fabrication of power windows the yttrium oxide coating 308 may be first polished and then treated to obtain a desired roughness. To obtain a target roughness, a plurality of test patches on the yttrium oxide coating surface are treated for different amounts of time (step 104). FIG. 4 is a more detailed flow chart of the step of treating a plurality of test patches. Reservoirs are provided on the surface of the yttrium oxide coating (step 404). In this example, a mold is provided on an outer edge of the yttrium oxide coated surface. FIG. 5 shows an enlarged section of the power window 204 with a temporary mold 504 forming reservoirs 508 for a plurality of test patches. In this example, the mold 504 is formed by polydimethylsiloxane (PDMS), which is attached to the power window 204. In this embodiment, the mold 504 is attached at an outer edge of the power window 204. In this example the other edge of the power window 204, would be outside of an O-ring, when mounted in a plasma processing chamber, so that the area where the mold is attached would not be subjected to a plasma. The hydrophobicity of the PDMS may be adjusted to provide a desired hydrophobic or hydrophilic property.

Figure 6:
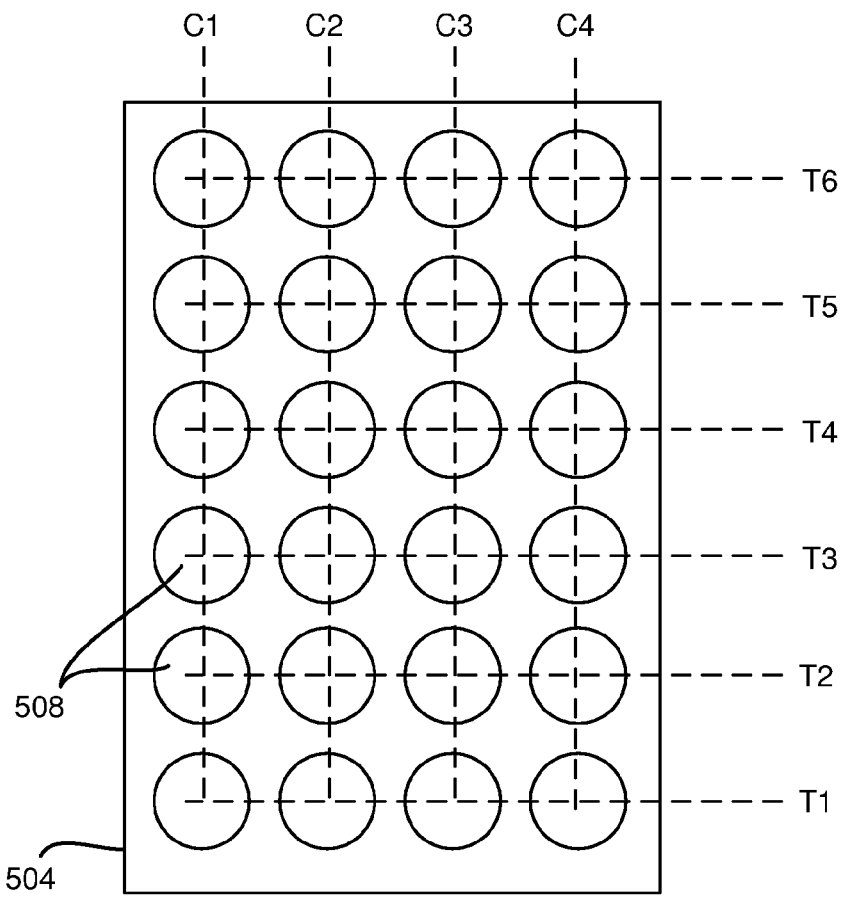
FIG. 6 is an enlarged view of the mold with reservoirs.

Liquid etchant is provided at different times (step 408) progressively. FIG. 6 is an enlarged view of the mold 504 with reservoirs 508. The dashed lines show that the reservoirs 508 are in columns C1-C4. Each column has a series of reservoirs identified by T1-T6. In this example, the liquid etchant is at least 0.02% by weight HCl. In this example, at t=s6 seconds the liquid etchant is added to T6 reservoir 508 in column C1. At t=s5 seconds the liquid etchant is added to T5 reservoir 508 in column C1. At t=s4 seconds the liquid etchant is added to T4 reservoir 508 in column C1. At t=s3 seconds the liquid etchant is added to T3 reservoir 508 in column C1. At t=s2 seconds the liquid etchant is added to T2 reservoir 508 in column C1. At t=s1 seconds the liquid etchant is added to T1 reservoir 508 in column C1. At 0 seconds, all the reservoirs in column C1 are quenched (step 412). This may be done by flooding the reservoirs with a base or washing away remaining liquid etchant. This series of testing can be repeated for C2-C4. In the alternative, the columns C1-C4 may be treated in parallel, where the liquid is dispensed in T6 for all columns C1-C4 at the same time at a t=max seconds and the sequence is repeated for T5-T1 time increments and then all columns are quenched at the same time at 0 seconds. The test patches are the surface of the widow at the bottom of the reservoirs. The reservoirs are removed (step 416). In this example, the reservoirs are removed by removing the mold 504.

The test patches are measured (step 108). In this example, the surface roughness of the etched test patterns is measured. In this example, an optical surface scan is used to measure surface roughness of each test patch. Since the mold has been removed, such an optical measurement is easier. In this example, the surface is dried to facilitate the measurement of surface area roughness. One example of an optical surface scan device would use a laser scanner. The results for test patterns in the same row may be averaged together.

Figure 7:
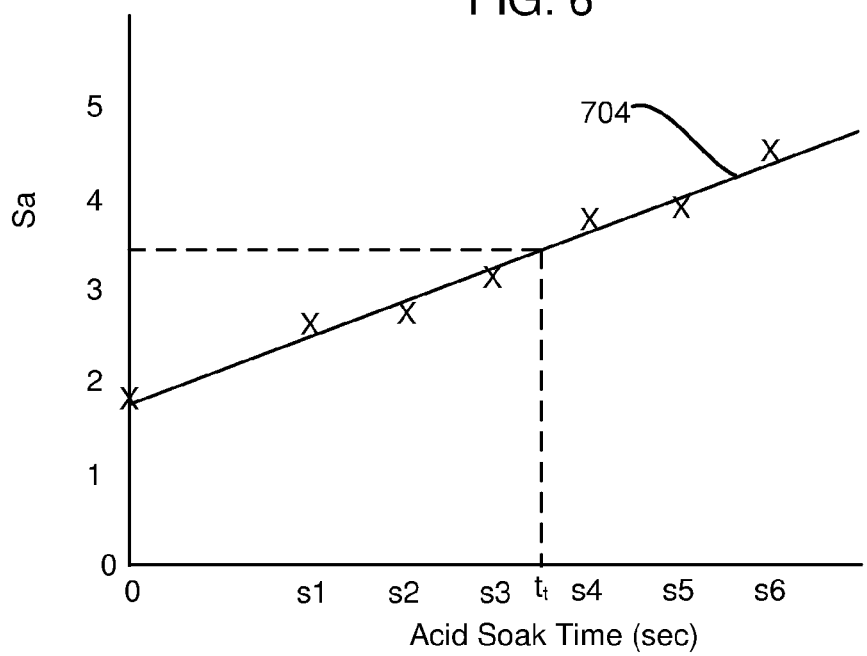
FIG. 7 is an example of a graph that would plot surface roughness.

The measurements from the test patches and the times for the different test patches are used to generate a calibration curve. FIG. 7 is an example of a graph that would plot surface roughness versus time in seconds. The surface roughness may also be measured before the surface is etched providing surface roughness at $t_0=0$, where the surface is etched for 0 seconds. In this example, a line is fitted to the averaged data points. In this example, the line 704 is the calibration curve. In other embodiment, the calibration curve may be a higher order function.

In this example, a target roughness is known. The target roughness may be determined by experiment. For example, it may be found that a target roughness may provide an optimal process, such as optimal etch. In addition, the target roughness may be found as an average optimal roughness. Using the calibration curve, a target time is found from the target roughness. For example, if a target roughness is 3.5 then a target time of $t_t$ seconds is found. In other embodiments, instead of graphing the calibration curve, a calibration curve function may be derived, so that the target roughness is plugged into the calibration curve function to obtain the target time.

The surface is treated for the target time (step 120). In this example, an entire surface of the yttrium oxide coating 308 is treated by exposure to at least 0.02% by weight HCl for $t_t$ seconds. In this example, the surface has an area greater than 1000 times the total surface area of the plurality of test patches.

By experiment, it has been found that for an yttrium oxide surface, the above example provides the target roughness for the entire surface of the yttrium oxide. In addition, it has been found that for some ceramic coatings, such as yttrium oxide that since the material is nonhomogeneous, the roughening rate properties change from object to object. This means that the $t_t$ second target time for this power window would not produce the same target roughness for the next power window. The measurement of surface roughness in real time during the wet etching is not practical due to compatibility issues created by the dipping process, and complexity in metrology required to perform reliable surface measurements.

The current method for fabricating power windows in manufacturing for production systems relies on a universal time based acid soak etch process. There has been a great deal of variability in yield primarily due to the fact that a universal time based acid etch approach has yielded power windows post acid etch with variable surface roughness. Parts are falling outside of tight specification limits and are being scrapped. As the specifications for post acid etch surfaces approach tighter tolerances, the smoother finishes having large variability has become a major problem impacting production yield. An undesirable production yield will have significant cost implications and will be an obstacle to productizing parts. None of the current approaches thus far have been very successful in either predicting or consistently meeting the post acid etch target roughness requirements on power windows. The variability in the bulk coating properties from power window to power window is identified to partially dominate the process outcome. Running witness coupons made from the same material and process as the power window has also been subject to these not well understood or controlled substrate affects. In addition, measuring roughness during etching has failed, since the roughness measurements were not effective on the power windows while the power windows are wet.

The current technology also lacks the means to efficiently measure roughness with in-process metrology. The power windows are examined off-line with microscope objective based 3d scanning laser systems. This often adds a considerable amount of time and cost to the manufacturing process. The proposed method discloses a way to perform surface roughness inspection of the defined arrays in-process very quickly by utilizing optical laser based surface probes that can be coupled to conventional scanning head hardware or alternatively by contact or non-contact based surface profilometers. An example of an optical laser based surface probe is a laser head on a traversing robot arm.

Providing an approach that takes into account the substrate affect and process to process variability is highly desirable. The disclosed method overcomes these obstacles by allowing a small area of the same substrate to be initially temporarily patterned, acid etch time split tested, and analyzed for surface roughness. The optimal time for the desired roughness value is derived from the data and applied to the remaining surface that is to be acid etched.

In addition, it was not obvious that for nonhomogeneous objects finding a target time for a small test patch would provide the target roughness for a much larger surface of the object.

In other embodiments, other types of molds may be used. The mold preferably is resistant to the liquid etchant and preferably may be bonded with the surface so that there is no leakage and yet may be easily removed. In addition to PDMS, the mold may be another polymeric organosilicon based compound. Such mold materials may be viscoelastic, acting like a viscous liquid that can be flowed to cover a surface. Upon polymerization and cross-linking, such compounds may form a solid film presenting an external hydrophobic surface that can be oxidized if hydrophilicity is desirable. Solid PDMS materials will not allow aqueous solvents to infiltrate and swell the material. The material can also be used in combination with aqueous based acid etch solutions without material deformation, and chemical compatibility concerns. In some embodiments, an adhesive tape with apertures may be used as a mold.

In some embodiments, an array of PDMS reservoirs temporarily confines the acid etch solution on the power window surface and allows for localized spot etch time based testing prior to the main surface etch. The reservoirs are fabricated such that the working fluid can fill them and contact a defined surface area for some time. The fluid can later be extracted from the surface and/or rinsed from the surface. For example, micro volumes of a fluid can be pipetted into and/or withdrawn from reservoirs in the array through a parallel or serial manual dispense process using progressive time based approach. Alternatively this step can also be automated. Independent rows in the array can define the various acid etch solution concentrations and or soak times intended for the split testing. The size and geometry of the spot sized reservoirs in the array is designed to maintain adequate surface to volume ratios similar to the main surface etch and a working distance range that is suitable for coupling to an automated fill/dispense system. The adhesion of the template to the surface is robust and will withstand any sequential spray rinse and dry steps. The templates are also reusable. Moreover, by removing the temporary template from the surface, after the etched spots are fabricated, the surface areas can be analyzed by a commercial optical scanning surface metrology such as an optical laser (i.e. scanning confocal objective, Lasercheck optical probe, luster sensor), optical profilometer, or a contact stylus profilometer. These surface metrologies can measure and quantify the surface roughness within the various test zones to determine optimal time for the intended main etch step. This unique characteristic allows an operator to pre-evaluate the surface roughness as a function of acid etch time on a localized portion of the power window with the same acid etch preparations and setup conditions that later will be used in the main surface etch step. This level of control allows the ability to predictably target and meet power window roughness specifications post acid etch.

In other embodiments, instead of forming test patterns on an outer edge, a more interior area may be used for the test patterns. In some embodiments, the area of the test patterns is subsequently etched. In other embodiment, the area of the test patterns is not etched, but blends with the etched main area. In other embodiments other liquid etchants may be used. Such liquid etchants may be other acids. Such acids may be inorganic acid, such as nitric acid or sulfuric acid, or may be organic acid. Different embodiments would provide different concentrations of the liquid etchants.

In other embodiments, a dry etch or vapor process may be used instead of using a wet etch to create the test patches. In such a process, the dry etch process is used to create a plurality of test patches or otherwise alternatively can be used to treat the nonhomogeneous areas defined by the test patches, which are both treated for different amounts of time. The dry process may be a plasma etch or a laser ablation based technique.

In the past, power windows that were used or over etched during manufacturing would be discarded, since they could not be reconditioned. Tolerances are tightening, which increases then percentage of power windows that are out of tolerance. Embodiments are able to recondition such power windows in order to reduce waste. In an embodiment, the power windows are polished to reduce the roughness of the power window. The process of FIG. 1 is then carried out. In other embodiments, power windows with one roughness may be refurbished to a different target roughness.

When used for a power window, a change in surface roughness causes a change in plasma etching results. By providing power windows with a roughness within a tight tolerance band the etch results are more uniform and more predictable. In addition, by having the same surface roughness in different plasma process chambers increases process uniformity between different chambers allowing for superior tool to tool performance matching.

While the method described can be used to tune surface roughness of power windows during the manufacturing process for etch equipment parts, it can also be applied to alternative semiconductor fabrication equipment part materials and surfaces that may require similar level pre-test process tuning and control. In various embodiments, the measurement of surface roughness, finish, texture, or topography may be used as a measured property.

In various embodiments, nonhomogeneous materials is defined as materials that have an aspect of nonhomogeneity with a variation of particle size or nano-void size, which results in a change in surface roughness, finish, texture, or topography from object to object for a set etch time. More preferably, such a nonhomogeneity provides a substantially consistent surface roughness, finish, texture, or topography for a surface on a single object. Such nonhomogeneous materials may be ceramics, quartz, alloys, or metals. Preferably, such nonhomogeneous materials are ceramics.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for treating a nonhomogeneous material surface of an object, comprising:
    treating a plurality of test patches of the surface for different amounts of time wherein the plurality of test patches have a total surface area;
    measuring a property of each test patch;
    generating a calibration curve of the property with respect to time;
    using the calibration curve and a target property to obtain a target time; and
    treating a surface of the object with a surface area, which is greater than the total surface area of the plurality of test patches, for the target time.

2. The method, as recited in claim 1, wherein the measuring a property of each test patch comprises measuring surface roughness, finish, texture, or topography of each test patch.

3. The method, as recited in claim 2, wherein the nonhomogeneous material is a ceramic material, quartz, alloy, or metal material.

4. The method, as recited in claim 3, wherein treating a plurality of patches of the surface for different amounts of time, comprises:
    applying a liquid etchant to each test patch of the plurality of test patches at different times, and
    quenching all test patches of the plurality of test patches at the same time;
    and wherein the treating the surface of the object comprises exposing the surface of the object to the liquid etchant for the target time.

5. The method, as recited in claim 4, wherein the measuring the surface roughness comprises using a microscope or laser head on a traversing robot arm to optically measure the surface roughness.

6. The method, as recited in claim 5, wherein the surface area of the treated surface of the object is at least 1000 times the total surface area of the plurality of test patches.

7. The method, as recited in claim 6, wherein the treating the plurality of patches further comprise applying a mold with reservoirs on the surface of the object, wherein each reservoir forms a test patch of the plurality of test patches; and further comprising removing the mold after quenching all of the test patches.

8. The method, as recited in claim 7, wherein the mold is formed from a polymeric organosilicon based compound or adhesive tape.

9. The method, as recited in claim 8, wherein the nonhomogeneous material is a ceramic material.

10. The method, as recited in claim 1, wherein the nonhomogeneous material is a ceramic material, quartz, alloy, or metal material.

11. The method, as recited in claim 1, wherein treating a plurality of patches of the surface for different amounts of time, comprises:
applying a liquid etchant to each test patch of the plurality of test patches at different times, and
quenching all test patches of the plurality of test patches at the same time; and
wherein the treating the surface of the object comprises exposing the surface of the object to the liquid etchant for the target time.

12. The method, as recited in claim 11, wherein the treating the plurality of patches further comprise applying a mold with reservoirs on the surface of the object, wherein each reservoir forms a test patch of the plurality of test patches; and further comprising removing the mold after quenching all of the test patches.

13. The method, as recited in claim 1, wherein the measuring the surface roughness comprises using a microscope or laser head on a traversing robot arm to optically measure the surface roughness.

14. The method, as recited in claim 1, wherein the surface area of the treated surface of the object is at least 1000 times the total surface area of the plurality of test patches.

15. The method, as recited in claim 1, wherein the treating the plurality of patches comprise applying a mold with reservoirs on the surface of the object, wherein each reservoir forms a test patch of the plurality of test patches; and further comprising removing the mold after quenching all of the test patches.

16. The method, as recited in claim 15, wherein the mold is formed from a polymeric organosilicon based compound or adhesive tape.

17. The method, as recited in claim 1, wherein the nonhomogeneous material is a ceramic material.

18. A method for treating a ceramic surface of a power window, comprising:
treating a plurality of test patches of the ceramic surface for different amounts of time wherein the plurality of test patches have a total surface area, comprising:
applying a mold with reservoirs on the surface of the power window, wherein each reservoir forms a test patch of the plurality of test patches;
applying a liquid etchant to each test patch of the plurality of test patches at different times, and
quenching all test patches of the plurality of test patches at the same time;
removing the mold;
measuring surface roughness of each test patch;
generating a calibration curve of the surface roughness with respect to time;
using the calibration curve and a target surface roughness to obtain a target time; and
treating the ceramic surface of the power window with a surface area, which is greater than the total surface area of the plurality of test patches, for the target time.

* * * * *